(12) United States Patent
Hagimori et al.

(10) Patent No.: US 10,725,109 B2
(45) Date of Patent: Jul. 28, 2020

(54) BATTERY MONITORING CIRCUIT (71) Applicants: Hitoshi Hagimori, Tokyo (JP);
Yasuhiro Kinoshita, Tokyo (JP)

(72) Inventors: Hitoshi Hagimori, Tokyo (JP);
Yasuhiro Kinoshita, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 403 days.

(21) Appl. No.: 15/797,048

(22) Filed: Oct. 30, 2017

(65) Prior Publication Data
US 2018/0149705 A1    May 31, 2018

(30) Foreign Application Priority Data
Nov. 25, 2016 (JP) ................... 2016-229421

(51) Int. Cl.
| G01R 31/36 | (2020.01) |
| G01R 31/382 | (2019.01) |
| G01R 31/367 | (2019.01) |
| G01R 31/374 | (2019.01) |

(52) U.S. Cl.
CPC ....... G01R 31/3648 (2013.01); G01R 31/367 (2019.01); G01R 31/382 (2019.01); *G01R 31/374* (2019.01)

(58) Field of Classification Search
CPC ................................. G01R 31/3648
USPC ........................................ 702/63
See application file for complete search history.

(56) References Cited

U.S. PATENT DOCUMENTS

| 5,606,243 A * | 2/1997 | Sakai ................. G01R 31/3648 320/134 |
| 9,581,653 B2 * | 2/2017 | Tao .................... H01M 10/4285 |
| 10,396,407 B2 * | 8/2019 | Mitsuyama .......... G01R 31/389 |
| 2003/0195719 A1 * | 10/2003 | Emori ................... B60W 10/26 702/183 |
| 2009/0087725 A1 * | 4/2009 | Sim ........................ G01R 1/203 429/90 |
| 2014/0095092 A1 * | 4/2014 | Ikeda .................... H01M 10/48 702/63 |
| 2014/0167656 A1 * | 6/2014 | Yamada .................... H02J 7/00 318/139 |

FOREIGN PATENT DOCUMENTS

JP    H07-098339    4/1995

* cited by examiner

*Primary Examiner* — Ricky Ngon
(74) *Attorney, Agent, or Firm* — IPUSA, PLLC (57) ABSTRACT

A battery monitoring circuit for a portable device driven by a secondary battery that supplies an electric current via a wiring pattern formed on a substrate. The battery monitoring circuit includes: a current measuring circuit that measures a current value of a current that flows in the wiring pattern by monitoring an amount of voltage drop that occurs in a specific section of the wiring pattern; a converter that converts the current value into a digital measured current value; a first storage part that stores data for compensating a variation in a resistance of the wiring pattern depending on an individual particularity of the substrate; and a calculating part configured to correct the digital measured current value by using the data to calculate a corrected current value and to calculate a remaining capacity or to monitor a state of the secondary battery based on the corrected current value.

6 Claims, 7 Drawing Sheets

BATTERY MONITORING CIRCUIT

CROSS-REFERENCE TO RELATED APPLICATIONS

This patent application is based upon and claims the benefit of priority of Japanese Patent Application No. 2016-229421 filed on Nov. 25, 2016, the entire contents of which are incorporated herein by reference.

BACKGROUND OF THE INVENTION

1. Field of the Invention

The present disclosure relates to a battery monitoring circuit.

2. Description of the Related Art

Conventionally, there exists a technique for detecting voltage drop that occurs in a specific section of a wiring pattern formed on a substrate to detect an electric current value of an electric current that flows in the wiring pattern (see Patent Document 1, for example).

However, because a resistance value of the wiring pattern formed on the substrate varies depending on an individual particularity of the substrate, it is difficult to accurately measure an electric current value of an electric current that flows in the wiring pattern by the conventional technique. When accuracy of measuring electric current values is low, accuracy of calculating a remaining capacity of a secondary battery, obtained by integrating electric current values, decreases.

Hence, an object in one aspect of the present disclosure is to provide a battery monitoring circuit such that accuracy of measuring an electric current value of an electric current that flows in a wiring pattern is improved and accuracy of calculating a remaining capacity of a secondary battery is improved.

RELATED ART DOCUMENT

Patent Document

[Patent Document 1]: Japanese Laid-open Patent Publication No. H07-98339

SUMMARY OF THE INVENTION

In order to achieve the above described object, according to an aspect of the embodiments, a battery monitoring circuit to be used for a portable device that is driven by a secondary battery that supplies an electric current to a load via a wiring pattern formed on a substrate. The battery monitoring circuit calculates a remaining capacity of the secondary battery monitor or monitors a state of the secondary battery. The battery monitoring circuit includes: an electric current measuring circuit configured to measure an electric current value of an electric current that flows in the wiring pattern by monitoring an amount of voltage drop that occurs in a specific section of the wiring pattern; an Analog-to-Digital converter configured to convert the electric current value measured by the electric current measuring circuit into a digital measured electric current value; a first storage part configured to store first correction data for compensating a variation in a resistance value of the wiring pattern depending on an individual particularity of the substrate; and a calculating part configured to correct the digital measured electric current value by using the first correction data to calculate a corrected electric current value and to calculate the remaining capacity or to monitor the state of the secondary battery based on the corrected electric current value.

DETAILED DESCRIPTION OF THE PREFERRED EMBODIMENTS

In the following, embodiments of the present disclosure will be described with reference to the drawings.

Figure 1:
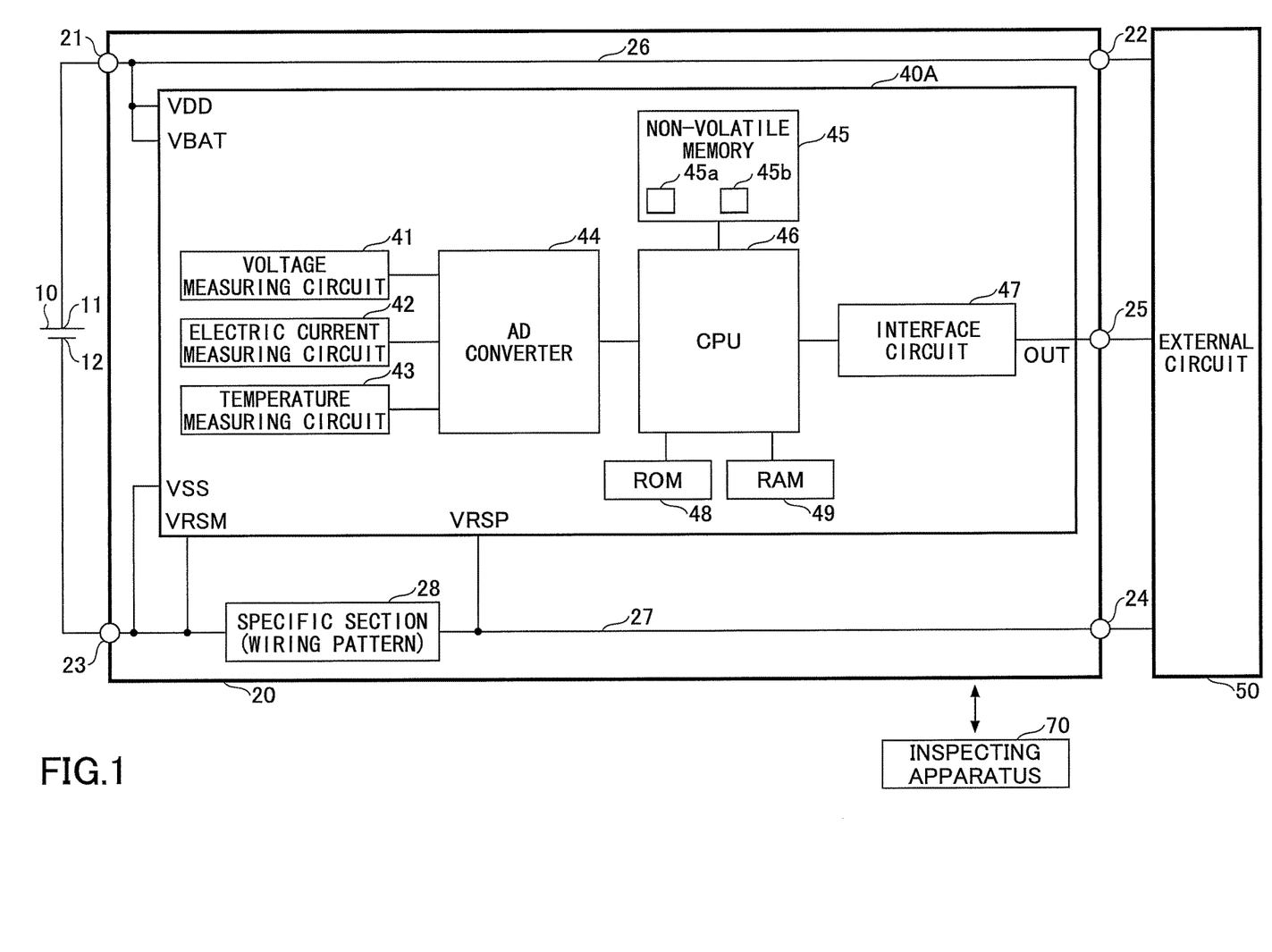
FIG. 1 is a diagram illustrating an example of a configuration of a battery monitoring circuit according to a first embodiment.

FIG. 1 is a diagram illustrating an example of a configuration of a battery monitoring circuit according to a first embodiment. A remaining battery power meter Integrated Circuit (IC) 40A illustrated in FIG. 1 is an example of the battery monitoring circuit. The remaining battery power meter IC 40A measures a remaining power (remaining capacity) of a secondary battery 10 and/or monitors a state of the secondary battery 10 based on a corrected electric current value that will be described later below, and provides the measurement result to an external circuit 50. The remaining battery power meter IC 40A is an example of a semiconductor integrated circuit to be used for a portable device that is driven by the secondary battery 10. The secondary battery 10 supplies an electric current to a load such as the external circuit 50 via a wiring pattern formed on a substrate 20.

The remaining battery power meter IC 40A is mounted on the substrate 20. For example, the substrate 20 may be a printed circuit board. A glass epoxy substrate may be a specific example of the printed circuit board. Although the external circuit 50 is not mounted on the substrate 20 in the illustrated embodiment, the substrate 20, on which the remaining battery power meter IC 40A is mounted, may be a common substrate on which the external circuit 50 is mounted. In other words, the substrate 20 may be a common circuit board on which both the remaining battery power meter IC 40A and an external circuit 50 are mounted.

The substrate 20 includes a battery plus side terminal 21, a load plus side terminal 22, a battery minus side terminal 23, a load minus side terminal 24, and an external output terminal 25. Further, on the substrate 20, a plus side wiring pattern 26 and a minus side wiring pattern 27 are formed. The plus side wiring pattern 26 is an electric current path that connects the battery plus side terminal 21 and the load plus side terminal 22. The minus side wiring pattern 27 is an electric current path that connects the battery minus side terminal 23 and the load minus side terminal 24. A specific section 28 represents a wiring pattern of a portion of the minus side wiring pattern 27.

A positive electrode 11 of the secondary battery 10 is connected to the battery plus side terminal 21, and a negative electrode 12 of the secondary battery 10 is connected to the battery minus side terminal 23. Specific examples of the secondary battery 10 are batteries such as a lithium-ion battery and a lithium polymer battery.

The remaining battery power meter IC 40A includes a power supply terminal VDD, a voltage measuring terminal VBAT, a ground terminal VSS, a first electric current detecting terminal VRSM, a second electric current detecting terminal VRSP, and an output terminal OUT. These six terminals are external connection terminals for connecting internal circuits of the remaining battery power meter IC 40A to outside the remaining battery power meter IC 40A. The output terminal OUT may be an input/output terminal that serves both as an input terminal and as an output terminal.

The power supply terminal VDD and the voltage measuring terminal VBAT are connected to the plus side wiring pattern 26. The ground terminal VSS and the first electric current detecting terminal VRSM are connected, between the battery minus side terminal 23 and one end of the specific section 28, to the minus side wiring pattern 27. The second electric current detecting terminal VRSP is connected, between the load minus side terminal 24 and the other end of the specific section 28, to the minus side wiring pattern 27. The output terminal OUT is connected to the external output terminal 25.

The remaining battery power meter IC 40A includes a voltage measuring circuit 41, an electric current measuring circuit 42, a temperature measuring circuit 43, an Analog-to-Digital (AD) converter 44, a non-volatile memory 45, a Central Processing Unit (CPU) 46, a Read Only Memory (ROM) 48, a Random Access Memory (RAM) 49, and an interface circuit 47 as internal circuits. These internal circuits are operated by a power supply voltage applied between the power supply terminal VDD and the ground terminal VSS based on a battery voltage of the secondary battery 10.

The voltage measuring circuit 41 monitors a voltage between the voltage measuring terminal VBAT and the ground terminal VSS to constantly measure a voltage value of the battery voltage of the secondary battery 10. The voltage measuring circuit 41 outputs an analog measured voltage value Vb that is a measured value of the voltage value of the battery voltage of the secondary battery 10. For example, the voltage measuring circuit 41 includes a resistor element for voltage-dividing a voltage between the voltage measuring terminal VBAT and the ground terminal VSS and outputs a measured voltage value Vb corresponding to the divided voltage value.

The electric current measuring circuit 42 monitors an amount of voltage drop that occurs at the specific section 28 of the minus side wiring pattern 27 via the first electric current detecting terminal VRSM and the second electric current detecting terminal VRSP to constantly measure an electric current value of an electric current that flows in the minus side wiring pattern 27. The electric current measuring circuit 42 outputs analog measured electric current values Ib that are measured values of the electric current values of the electric current that flows in the minus side wiring pattern 27. For example, the electric current measuring circuit 42 includes an amplifier that amplifies a voltage between the first electric current detecting terminal VRSM and the second electric current detecting terminal VRSP to output a measured electric current value Ib corresponding to an output value of the amplifier.

In this way, the specific section 28, which is a part of the minus side wiring pattern 27, is used as a means (unit) to detect the amount of voltage drop. The specific section 28 has a resistance value determined depending on conditions such as a length, a width, and a thickness of a conductor pattern and a resistivity of a metal material used for the minus side wiring pattern 27.

The temperature measuring circuit 43 constantly measures an ambient temperature around the minus side wiring pattern 27 (around the specific section 28, more preferably) to output analog measured temperature values Tb that are measured values of the temperature. For example, the temperature measuring circuit 43 includes a thermistor of which the resistance value changes in accordance with the ambient temperature, and outputs a measured temperature value Tb that changes in accordance with an output value of the thermistor.

The AD converter 44 converts the analog measured voltage value Vb into a digital measured voltage value Vs. The AD converter 44 converts the analog measured electric current value Ib into a digital measured electric current value Is. The AD converter 44 converts the analog measured temperature value Tb into a digital measured temperature values Ts.

The non-volatile memory 45 is an example of a storage part that stores correction data for compensating a variation in a resistance value of a wiring pattern (which is the specific section 28, more specifically) formed on the substrate 20. When the resistance value of the specific section 28 varies, the amount of voltage drop that occurs in the specific section 28 varies even if an electric current value of an electric current that flows in the minus side wiring pattern 27 does not change. When the amount of voltage drop that occurs in the specific section 28 varies, both the analog measured electric current value Ib and the digital measured electric current value Is vary, and therefore an error occurs in a result calculated by the CPU 46 using the measured electric current value Is.

In order to prevent such an error from occurring, an inspecting apparatus 70 writes (records), in the non-volatile memory 45 in advance, correction data for compensating a variation in the resistance value after the remaining battery power meter IC 40A is mounted on the substrate 20.

The non-volatile memory 45 includes a first non-volatile storage part 45a and a second non-volatile storage part 45b. The first storage part 45a stores first correction data for compensating a variation in a resistance value of a wiring pattern (which is the specific section 28, more specifically) depending on an individual particularity (individual difference) of the substrate 20. The first correction data includes one or more kinds of data (data for individual particularity correction). The second storage part 45b stores second correction data for compensating a variation in a resistance value depending on a temperature property of a wiring pattern (which is the specific section 28, more specifically).

The second correction data includes one or more kinds of data (data for temperature correction).

The CPU 46 obtains, from the AD converter 44, a measured voltage value Vs, a measured electric current value Is, and a measured temperature value Ts. Further, the CPU 46 reads the first correction data from the first non-volatile storage part 45a and reads the second correction data from the second non-volatile storage part 45b.

The CPU 46 is an example of a calculating part that corrects the measured electric current value Is. Calculation processes such as a correction executed by the CPU 46 are realized by one or more programs stored in the ROM 48. The CPU 46 calculates a corrected electric current value obtained by correcting the measured electric current value Is. That is, the CPU 46 calculates an electric current value after correcting the measured electric current value Is.

For example, the CPU 46 integrates calculated corrected electric current values to calculate a remaining capacity of the secondary battery 10 connected to the minus side wiring pattern 27 via the battery minus side terminal 23. For example, the CPU 46 may correct the calculated value of the remaining capacity of the secondary battery 10 by using a measured voltage value Vs in a state where charging/discharging of the secondary battery 10 is stopped. It should be noted that the electric current measuring circuit 42 may measure electric current values of an electric current that flows in the minus side wiring pattern 27, the AD converter 44 may convert the respective analog measured electric current values Ib, output from the electric current measuring circuit 42, into digital measured electric current values Is, and the CPU 46 may correct, based on the first correction data and/or the second correction data, the respective digital measured electric current values Is to obtain corrected electric current values.

The CPU 46 outputs, to the interface circuit 47, at least one of a calculated corrected electric current value and a calculated value (such as a calculated remaining capacity, for example) obtained by using the corrected electric current value in predetermined calculation. That is, the CPU 46 outputs, to the interface circuit 47, a calculation result.

The interface circuit 47 converts the calculation result output from the CPU 46 into a predetermined output format, and output it from the output terminal OUT. Thereby, the correction result output from the CPU 46 is provided to the external circuit 50.

The interface circuit 47 may be a communication interface circuit, for example. A serial communication interface circuit by an Inter-Integrated Circuit (I²C) may be a specific example of the communication interface circuit. In a case of I²C, the remaining battery power meter IC 40A includes a clock input terminal other than the output terminal OUT used as a data input/output terminal.

Next, a process of calculating first correction data for compensating a variation in a resistance value of a wiring pattern depending on an individual particularity of the substrate 20 and a process of storing the first correction data into the first storage part 45a will be described.

Figure 2:
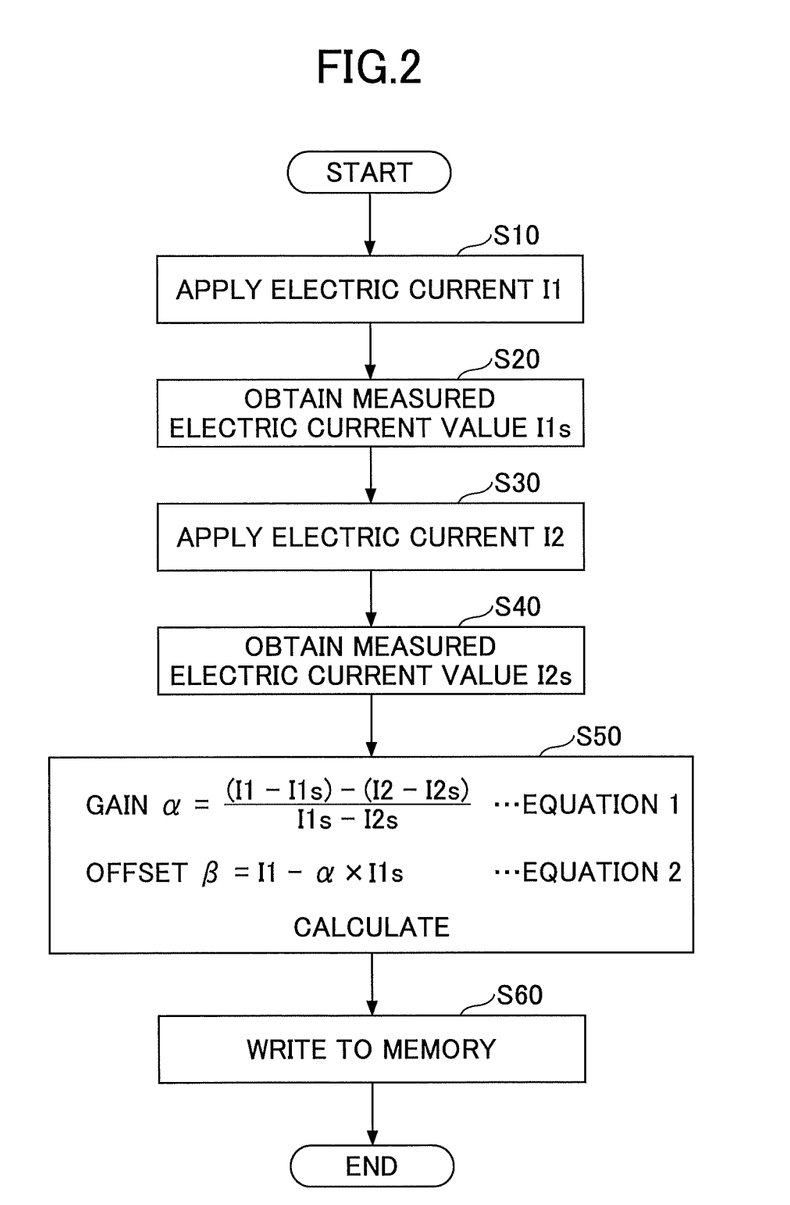
FIG. 2 is a flowchart illustrating an example of a process of calculating first correction data and a process of storing the first correction data into a first storage part.

FIG. 2 is a flowchart illustrating an example of the process of calculating the first correction data and the process of storing the first correction data into the first storage part 45a. Each process illustrated in FIG. 2 is executed after the remaining battery power meter IC 40A is mounted on the substrate 20 under an environment of constant temperature (which is 25° C., for example) and is executed before the substrate 20 on which the remaining battery power meter IC 40A is mounted, is shipped out (or before a portable device having the substrate 20 on which the remaining battery power meter IC 40A is mounted). That is, each process illustrated in FIG. 2 is executed by at least one inspecting apparatuses 70 in an inspection step before the shipment (delivery) of the product.

In step S10, so as to cause an applied electric current I1 whose electric current value is known to flow in the minus side wiring pattern 27 including the specific section 28, the inspecting apparatus 70 applies the applied electric current I1 between the load minus side terminal 24 and the battery minus side terminal 23.

In step S20, the inspecting apparatus 70 obtains, from the interface circuit 47 and the output terminal OUT, a measured electric current value I1s obtained by the CPU 46 from the AD converter 44 in a state in which the applied electric current I1 is being applied.

In step S30, so as to cause an applied electric current I2 whose electric current value is known to flow in the minus side wiring pattern 27 including the specific section 28, the inspecting apparatus 70 applies the applied electric current I2 between the load minus side terminal 24 and the battery minus side terminal 23. The electric current value of the applied electric current I2 is different from the electric current value of the applied electric current I1. For example, the electric current value of the applied electric current I2 is greater than that of the applied electric current I1.

In step S40, the inspecting apparatus 70 obtains, from the interface circuit 47 and the output terminal OUT, a measured electric current value I2s obtained by the CPU 46 from the AD converter 44 in a state in which the applied electric current I2 is being applied.

Figure 3:
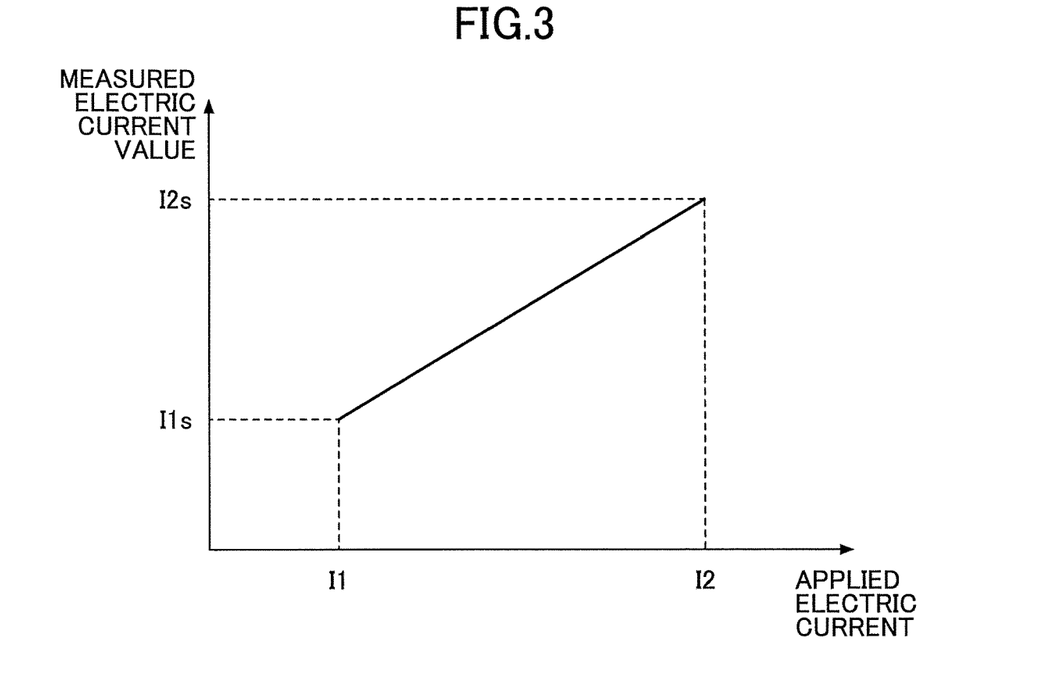
FIG. 3 is a diagram illustrating an example of a relationship between an applied electric current and a measured electric current value.

FIG. 3 is a diagram illustrating an example of a relationship between an applied electric current and a measured electric current value. That is, the inspecting apparatus 70 detects, in steps S10 and S20, a deviation of the measured electric current value I1s with respect to the current value of the applied electric current I1 and detects, in steps S30 and S40, a deviation of the measured electric current value I2s with respect to the current value of the applied electric current I2. In other words, at least one inspecting apparatus 70 may detect a difference between the measured electric current value I1s and the current value of the applied electric current I1 and detect the measured electric current value I2s and the current value of the applied electric current I2.

In step S50, the inspecting apparatus 70 substitutes electric current values of the applied electric currents I1 and I2 applied in steps S10 and S30 and the measured electric current values I1s and I2s obtained in steps S20 and S40 into equations 1 and 2 to calculate a gain α and an offset β. The gain α and offset β represent respective coefficients of an equation 3 that is a primary expression illustrated in FIG. 6.

In step S60, the inspecting apparatus 70 stores the gain α and the offset β, calculated in step S50, in the first storage part 45a from the output terminal OUT or a writing terminal (not illustrated).

Figure 6:
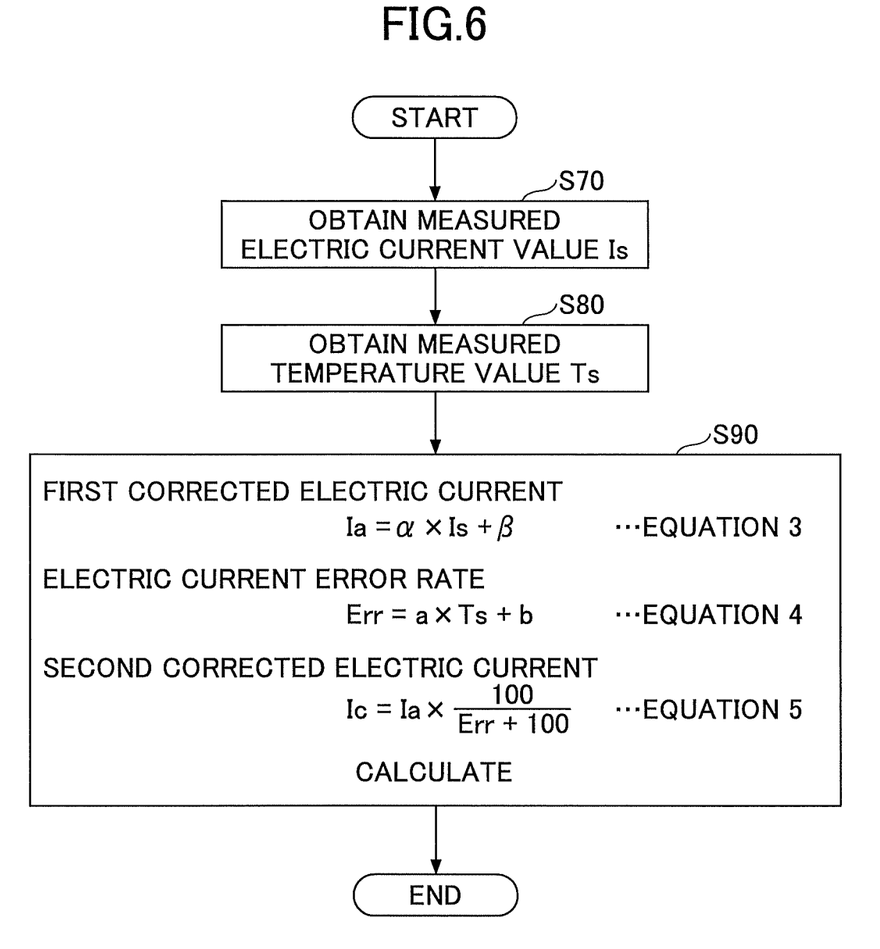
FIG. 6 is a flowchart illustrating an example of a process of calculating a corrected electric current value.

Accordingly, in a product state after the shipment of the product, the CPU 46 substitutes the gain α and the offset β, read from the first storage part 45a, and a measured electric current value Is into the equation 3 illustrated in FIG. 6. Thereby, it is possible to calculate the first corrected electric current value Ia that is an electric current value after correcting the measured electric current value Is.

In this way, even when an error occurs in the measured electric current value Is due to the variation in the resistance value of the wiring pattern depending on an individual particularity of the substrate 20, the CPU 46 can accurately calculate the electric current value of the electric current flowing in the minus side wiring pattern 27 as the first corrected electric current value Ia. Therefore, it is possible to enhance accuracy of measuring the electric current value of the electric current flowing in the minus side wiring pattern 27.

Next, a process of calculating second correction data for compensating a variation in a resistance value depending on a temperature property of a wiring pattern and a process of storing the second correction data into the second storage part 45b will be described.

The temperature property of the resistance value of the specific section 28, which is a part of a wiring pattern, is affected by a material of the wiring pattern.

Figure 4:
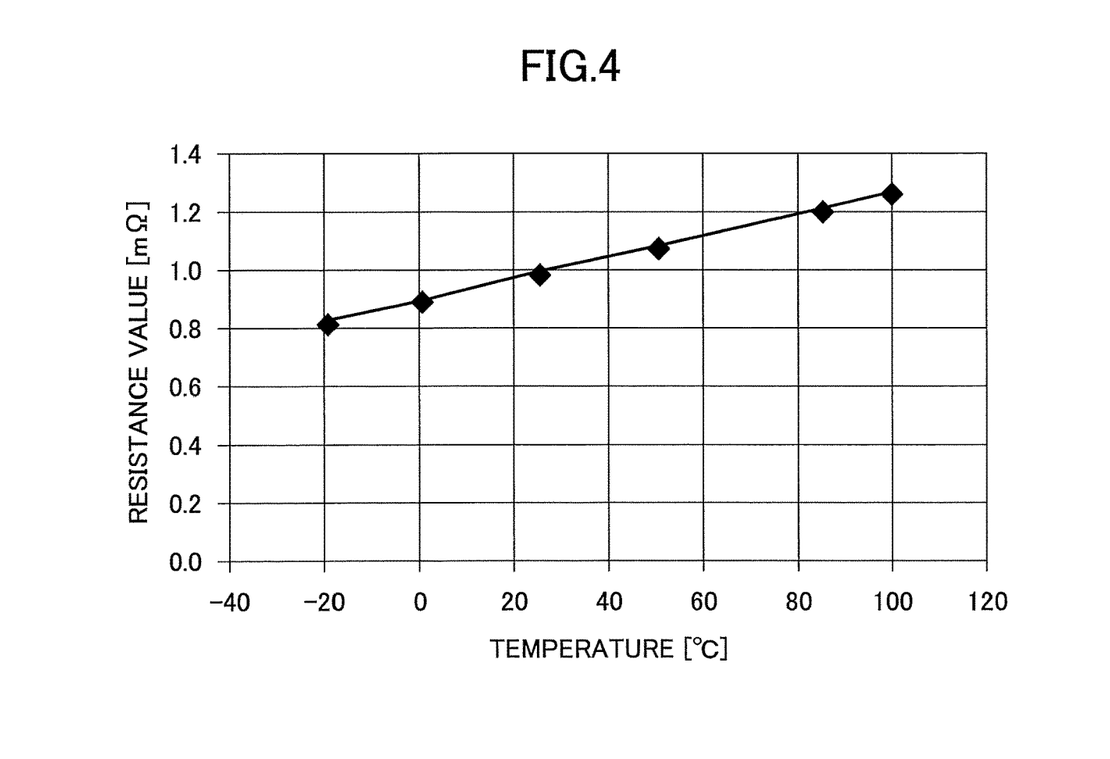
FIG. 4 is a diagram illustrating an example of a relationship between a temperature and a resistance value of a wiring pattern.

FIG. 4 is a diagram illustrating an example of a relationship between a temperature and a resistance value of a wiring pattern. In the example illustrated in FIG. 4, a material of the wiring pattern is copper and a resistance value at 25° C. of the wiring pattern is 1 mΩ. As illustrated in FIG. 4, the resistance value of the wiring pattern changes substantially linearly in proportion to the temperature.

Figure 5:
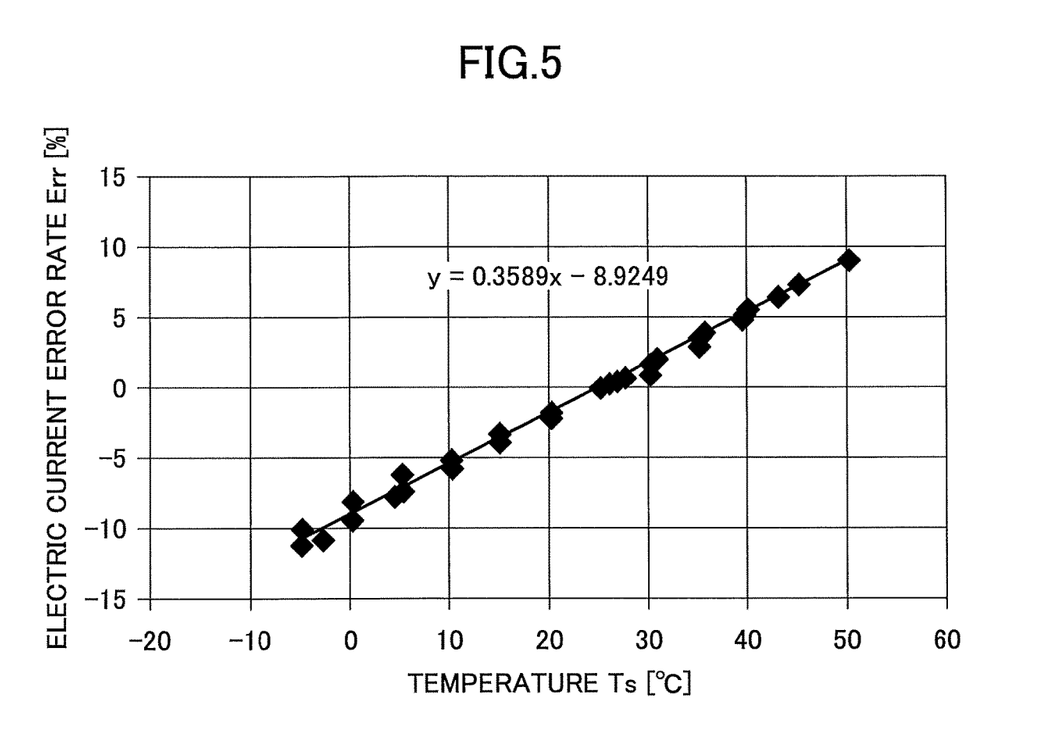
FIG. 5 is a diagram illustrating an example of a relationship between a measured temperature value and an error rate of a corrected electric current value for which a variation in a resistance value depending on an individual particularity of a substrate has been compensated.

FIG. 5 is a diagram illustrating an example of a relationship between a measured temperature value Ts and an electric current error rate Err of a first corrected electric current value Ia for which a variation in a resistance value depending on an individual particularity of a substrate has been compensated. The electric current error rate Err represents an error rate of the first corrected electric current value Ia with respect to a predetermined reference electric current value Ir (Err=(Ia−Ir)/Ir×100%). The reference electric current value Ir represents an electric current value when the measured temperature value Ts is a reference temperature (which is 25° C. in the case of FIG. 5). As illustrated in FIG. 5, the electric current error rate Err has a substantially linear property with respect to the measured temperature value Ts.

In this way, because the electric current error rate Err changes substantially linearly in proportion to the measured temperature value Ts, approximate equations 4 and 5 illustrated in FIG. 6 can be made. That is, the inspecting apparatus 70 stores, in the second storage part 45b, coefficients "a" and "b" of the equation 4 as the second correction data for compensating the variation in the resistance value depending on the temperature property of the wiring pattern. In the case of FIG. 5, the approximate equation "y=0.3589x−8.9249" can be made where "y" represents the electric current error rate Err and "x" represents the measured temperature value Ts. Here. 0.3589 is an example of the coefficient "a" and −8.9249 is an example of the coefficient "b".

FIG. 6 is a flowchart illustrating an example of a process of calculating a corrected electric current value. Each process illustrated in FIG. 6 is executed by the CPU 46 in a product state after the shipment of the product.

In step S70, the CPU 46 obtains, from the AD converter 44, a digital measured electric current value Is. In step S80, the CPU 46 obtains, from the AD converter 44, a digital measured temperature value Ts.

In step S90, the CPU 46 substitutes the gain α and the offset β read from the first storage part 45a and the measured electric current value Is into the equation 3 to calculate a first corrected electric current value Ia that is an electric current value after correcting the measured electric current value Is. Then, the CPU 46 substitutes the coefficient "a" and the coefficient "b" read from the second storage part 45b and the measured temperature value Ts into the equation 4 to calculate an electric current error rate Err. Then, the CPU 46 substitutes the first corrected electric current value Ia and the electric current error rate Err into the equation 5 to calculate a second corrected electric current value Ic that is an electric current value after correcting the first corrected electric current value Ia.

That is, even when an error occurs in the measured electric current value Is due to the variation in the resistance value depending on the temperature property of the wiring pattern of the substrate 20, the CPU 46 can accurately calculate the electric current value of the electric current flowing in the minus side wiring pattern 27 as the second corrected electric current value Ic. Therefore, it is possible to enhance accuracy of measuring the electric current value of the electric current flowing in the minus side wiring pattern 27.

Accordingly, accuracy of calculating a remaining capacity of the secondary battery 10 can be enhanced, for example, by the CPU 46 integrating second corrected electric current values Ic with respect to time to calculate the remaining capacity of the secondary battery 10. Note that the CPU 46 may integrate first corrected electric current values Ia with respect to time to calculate the remaining capacity of the secondary battery 10 such that accuracy of calculating the remaining capacity of the secondary battery 10 can be enhanced.

Alternatively or additionally, the CPU 46 may use the first corrected electric current value Ia or the second corrected electric current value Ic to calculate (detect) a state of the secondary battery 10. In other words, using the first corrected electric current value Ia or the second corrected electric current value Ic, the CPU 46 may calculate (detect) at least one of a dischargeable time of the secondary battery 10, a chargeable time of the secondary battery 10, a charging rate of the secondary battery 10, and a deterioration rate of the secondary battery 10. By using the first corrected electric current value Ia or the second corrected electric current value Ic, these calculation accuracy can be enhanced. Further, the CPU 46 may compare the first corrected electric current value Ia or the second corrected electric current value Ic with a predetermined abnormal current detection threshold to detect, as an example of a state of the secondary battery 10, an abnormal electric current flowing in the secondary battery 10. By using the first corrected electric current value Ia or the second corrected electric current value Ic, accuracy of detecting an abnormal electric current is enhanced. The abnormal electric current may be a discharge overcurrent, a charge overcurrent or the like of the secondary battery 10. In this way, the remaining battery power meter IC 40A can monitor status of the secondary battery 10.

Further, rather than a chip resistor, a part of the wiring pattern is used as a means (unit) to measure an electric current. Therefore, it is possible to reduce a component cost of a portable device having the substrate 20 on which the remaining battery power meter IC 40A is mounted. Further, by replacing a chip resistor with a part of the wiring pattern, a workload of mounting the chip resistor on the substrate 20 can be omitted, and therefore the workload of implementing the substrate 20 can be reduced. Furthermore, by replacing the chip resistor with the part of the wiring pattern, an area of the substrate 20 can be reduced by an area corresponding to the omitted chip resistance. Reducing the size of the substrate 20 is effective for a portable device requested to reduce the space.

Figure 7:
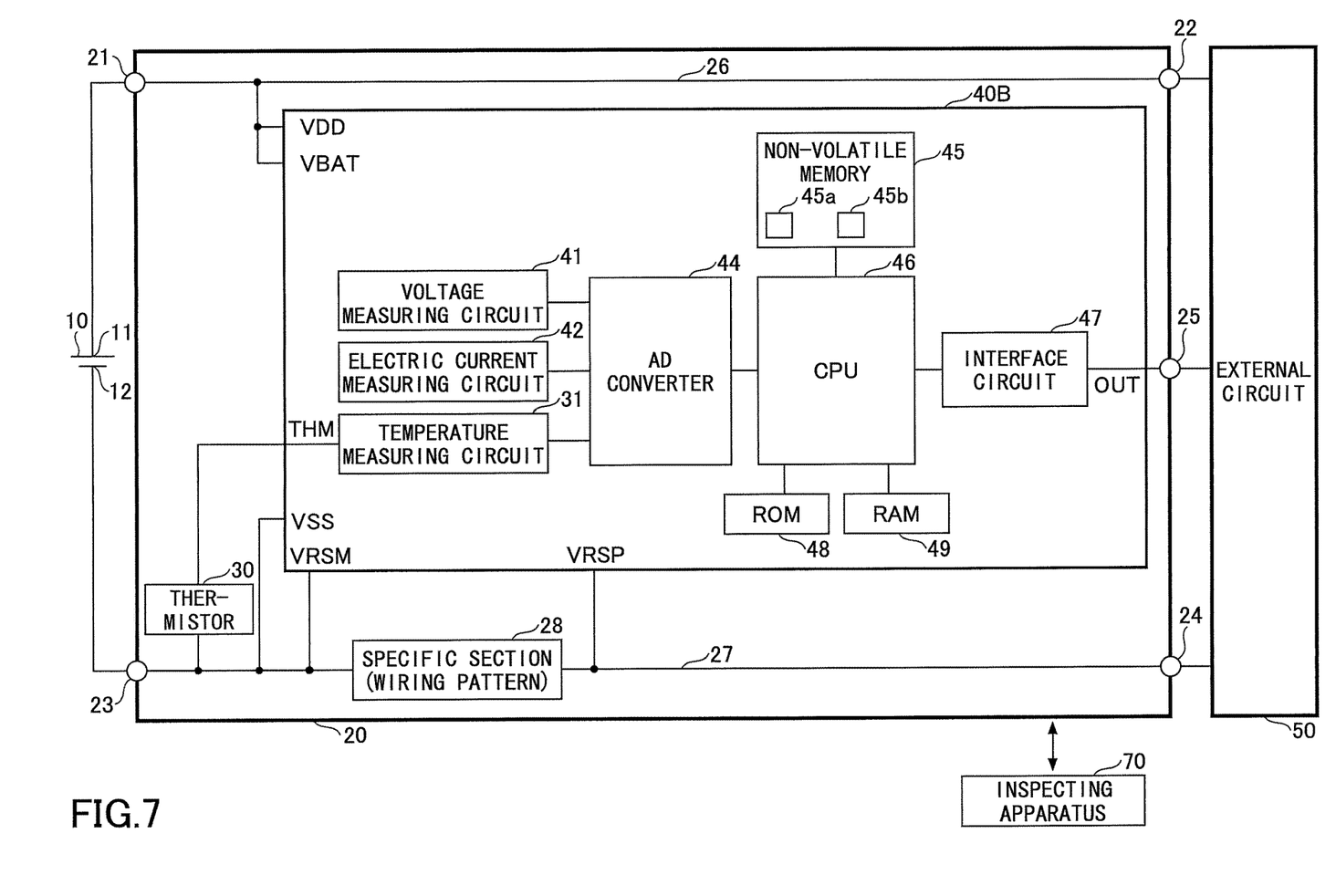
FIG. 7 is a diagram illustrating an example of a configuration of a battery monitoring circuit according to a second embodiment.

FIG. 7 is a diagram illustrating an example of a configuration of a battery monitoring circuit according to a second embodiment. In the description of the second embodiment, configurations and effects equivalent to those of the first embodiment are omitted or simplified appropriately by incorporating the above description.

A remaining battery power meter IC 40B illustrated in FIG. 7 has a configuration different from that illustrated in FIG. 1 in that the remaining battery power meter IC 40B includes a temperature measuring circuit 31 that uses a thermistor 30 provided outside the remaining battery power meter IC 40B to constantly measure a temperature around the minus side wiring pattern 27 (around the specific section 28, more preferably). Further, the remaining battery power meter IC 40B includes a thermistor input terminal THM for connecting the thermistor 30 and the temperature measuring circuit 31.

The temperature measuring circuit 31 outputs an analog measured temperature value Tb that changes in accordance with an output value of the thermistor 30. For example, the temperature measuring circuit 31 includes an attenuator that attenuates the output value of the thermistor 30 input from the thermistor input terminal THM, and outputs a measured temperature value in accordance with the output value of the attenuator. The resistance value of the thermistor 30 changes in accordance with an ambient temperature. For example, one end of the thermistor 30 is connected to the thermistor input terminal THM, and the other end of the thermistor 30 is connected, between the battery minus side terminal 23 and one end of the specific section 28, to the minus side wiring pattern 27.

By using the thermistor 30, the thermistor 30 can be easily arranged close to the specific section 28. Therefore, the temperature measuring circuit 31 can measure an ambient temperature around the specific section 28 with high accuracy. Further, by using the thermistor 30, it becomes unnecessary to make a position, at which the remaining battery power meter IC 40B is mounted on the substrate 20, close to the specific section 28. Therefore, degree of freedom of a mounting layout on the substrate 20 can be enhanced.

Figure 8:
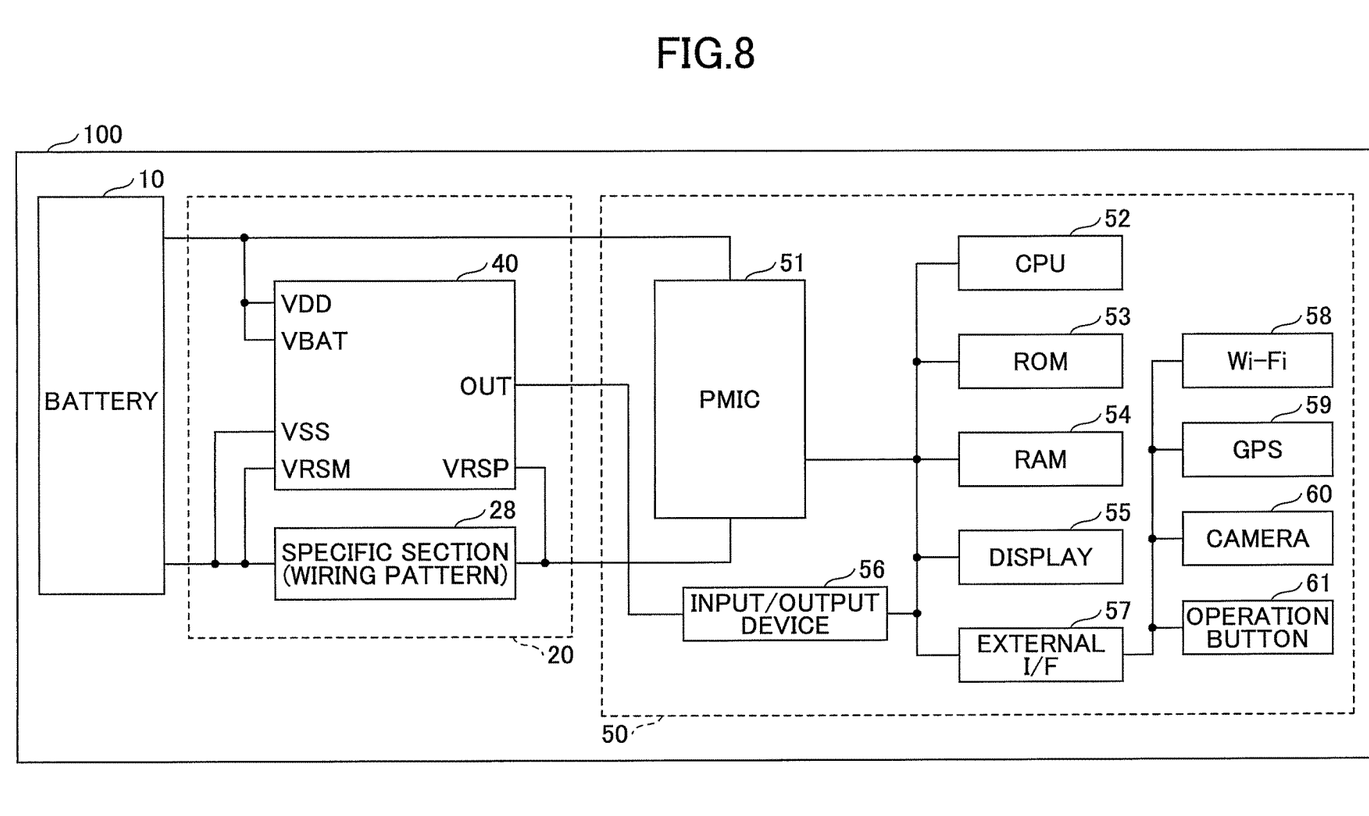
FIG. 8 is a diagram illustrating an example of a configuration of a portable device having a substrate on which a battery monitoring circuit is mounted.

FIG. 8 is a diagram illustrating an example of a configuration of a portable device having a substrate on which a battery monitoring circuit is mounted. A remaining battery power meter IC 40 illustrated in FIG. 8 is the remaining battery power meter IC 40A or 40B described above. FIG. 8 illustrates an example of a configuration of a mobile device 100 having the substrate 20 on which the remaining battery power meter IC 40 is mounted.

The mobile device 100 is an example of an electronic device that a user can carry. Specific examples of the mobile device 100 include a portable phone, a smartphone, a tablet terminal, and a notebook personal computer. The mobile device 100 includes the secondary battery 10, which is a power supply of the mobile device 100, the substrate 20, on which the remaining battery power meter IC 40 is mounted, and the external circuit 50, to which a measurement result of the remaining battery power meter IC 40 is provided.

The external circuit 50 includes a power management IC (PMIC) 51, a CPU 52, a ROM, a RAM 54, a display 55, an input/output device 56, an external interface (I/F) 57, a Wi-fi (registered trade mark) communication part 58, a Global Positioning System (GPS) communication part 59, a camera 60, and an operation button 61.

The PMIC 51 is an example of a circuit that controls charging of the secondary battery 10. The input/output device 56 obtains a calculation result such as a remaining capacity calculated by the CPU 46 in the remaining battery power meter IC 40, and supplies the obtained calculated result to at least one of the PMIC 51, the CPU 52, the RAM 54, the display 55, and the external I/F 57.

Thereby, the CPU 52 and the PMIC 51 can accurately execute, in accordance with at least one program stored in the ROM 53, a predetermined process such as a process of managing a power supply by using the calculated result such as the remaining capacity. Further, the display 55 can display information such as the remaining capacity of the secondary battery 10. As a result, a user can view the information such as the remaining capacity of the secondary battery 10, and can perform, in accordance with the viewed content (displayed information), a touch operation of the display 55 or a push operation of the operation button 61.

Although the battery monitoring circuits have been described above with reference to the embodiments, the present invention is not limited to the above described embodiments. It should be understood that the various changes, substitutions, and alterations could be made hereto without departing from the spirit and scope of the invention. Further, all or part of the components of the embodiments described above may be combined.

For example, a correction process for compensating a variation in a resistance value of a wiring pattern depending on an individual particularity of a substrate and a correction process for compensating a variation in the resistance value depending on a temperature property of the wiring pattern may be realized by different CPUs.

Further, the specific section 28 may be a portion of the plus side wiring pattern 26 instead of a portion of the minus side wiring pattern 27.

Further, in the above described embodiments, the remaining battery power meter ICs have been described as examples of a battery monitoring circuit. However, the battery monitoring circuit is not limited to a circuit having a function to calculate a remaining capacity of a secondary battery, but may be a circuit that monitors a state of a secondary battery except for a remaining capacity of the secondary battery. Also, the battery monitoring circuit may be a circuit that is able to detect (determine) a remaining capacity and a state of a secondary battery.

What is claimed is:

1. A battery monitoring circuit to be used for a portable device that is driven by a secondary battery that supplies an electric current to a load via a wiring pattern formed on a substrate, the battery monitoring circuit being configured to calculate a remaining capacity of the secondary battery monitor or to monitor a state of the secondary battery, the battery monitoring circuit comprising:
   an electric current measuring circuit configured to measure an electric current value of an electric current that flows in the wiring pattern by monitoring an amount of voltage drop that occurs in a specific section of the wiring pattern;
   an Analog-to-Digital converter configured to convert the electric current value measured by the electric current measuring circuit into a digital measured electric current value;
   a first storage part configured to store first correction data for compensating a variation in a resistance value of the wiring pattern depending on an individual particularity of the substrate; and
   a calculating part configured to correct the digital measured electric current value by using the first correction data to calculate a corrected electric current value and to calculate the remaining capacity or to monitor the state of the secondary battery based on the corrected electric current value,
   wherein the first correction data includes a coefficient α and a coefficient β, and wherein the calculating part corrects the digital measured electric current value in accordance with an equation of $Ia=\alpha \times I+\beta$ where the I represents the digital measured electric current value and the Ia represents the corrected electric current value.

2. The battery monitoring circuit according to claim 1, further comprising:

a temperature measuring circuit configured to measure a temperature around the wiring pattern, wherein the Analog-to-Digital converter converts the temperature measured by the temperature measuring circuit into a digital measured temperature value, and wherein the calculating part corrects the digital measured electric current value by using the first correction data and the digital measured temperature value.

3. The battery monitoring circuit according to claim 2, wherein the calculating part calculates an error rate of the corrected electric current value with respect to a predetermined reference electric current value by using the digital measured temperature value, and corrects the corrected electric current value by using the error rate.

4. The battery monitoring circuit according to claim 2, further comprising:

a second storage part configured to store second correction data for compensating a variation in the resistance value depending on a temperature property of the wiring pattern, wherein the calculating part corrects the digital measured electric current value by using the first correction data, the second correction data, and the digital measured temperature value.

5. The battery monitoring circuit according to claim 1, wherein the electric current measuring circuit measures electric current values of the electric current that flows in the wiring pattern, wherein the Analog-to-Digital converter converts the electric current values measured by the electric current measuring circuit into digital measured electric current values, wherein the calculating part corrects the digital measured electric current values by using the first correction data to calculate corrected electric current values, and wherein the calculating part calculates the remaining capacity by integrating the corrected electric current values.

6. A battery monitoring circuit to be used for a portable device that is driven by a secondary battery that supplies an electric current to a load via a wiring pattern formed on a substrate, the battery monitoring circuit being configured to calculate a remaining capacity of the secondary battery monitor or to monitor a state of the secondary battery, the battery monitoring circuit comprising:

an electric current measuring circuit configured to measure an electric current value of an electric current that flows in the wiring pattern by monitoring an amount of voltage drop that occurs in a specific section of the wiring pattern;

an Analog-to-Digital converter configured to convert the electric current value measured by the electric current measuring circuit into a digital measured electric current value;

a first storage part configured to store first correction data for compensating a variation in a resistance value of the wiring pattern depending on an individual particularity of the substrate;

a calculating part configured to correct the digital measured electric current value by using the first correction data to calculate a corrected electric current value and to calculate the remaining capacity or to monitor the state of the secondary battery based on the corrected electric current value;

a temperature measuring circuit configured to measure a temperature around the wiring pattern; and a second storage part configured to store second correction data for compensating a variation in the resistance value depending on a temperature property of the wiring pattern, wherein the Analog-to-Digital converter converts the temperature measured by the temperature measuring circuit into a digital measured temperature value, wherein the calculating part corrects the digital measured electric current value by using the first correction data, the second correction data, and the digital measured temperature value, wherein the first correction data includes a coefficient $\alpha$ and a coefficient $\beta$, wherein the second correction data includes a coefficient a and a coefficient b, and wherein the calculating part corrects the digital measured electric current value in accordance with an equation of $Ic=((\alpha \times I+\beta) \times 100)/((a \times T+b)+100)$ where the I represents the digital measured electric current value, the T represents the digital measured temperature value, and the Ic represents the corrected electric current value.

* * * * *